United States Patent [19]
Nogami et al.

[11] Patent Number: 6,117,769
[45] Date of Patent: Sep. 12, 2000

[54] PAD STRUCTURE FOR COPPER INTERCONNECTION AND ITS FORMATION

[75] Inventors: Takeshi Nogami, Sunnyvale; Susan Chen, Santa Clara; Shekhar Pramanick, Fremont, all of Calif.

[73] Assignee: Advanced Micro Devices, Inc., Sunnyvale, Calif.

[21] Appl. No.: 09/132,562

[22] Filed: Aug. 11, 1998

[51] Int. Cl.[7] .................................................. H01L 21/44
[52] U.S. Cl. .......................... 438/653; 438/687; 438/688; 438/656
[58] Field of Search ..................... 438/597, 627, 438/643, 648, 653, 656, 685, 687, 688, 654

[56] References Cited

U.S. PATENT DOCUMENTS 5,714,418  2/1998  Bai et al. ................................. 438/627

OTHER PUBLICATIONS

Kyung–Hoon Min, et al. "Comparative study of tantalum and tantalum nitrides . . . ", J. Vac. Sci. Technol. B 14(5) pp. 3263–3269, Sep. 1996.

Bhola Mehrotra et al. "Properties of direct current magnetron reactively sputtered TaN" J. Vac. Sce, Technol. B 5(6) pp. 1736–1740, Nov. 1987.

*Primary Examiner*—Caridad Everhart
*Attorney, Agent, or Firm*—Mikio Ishimaru

[57] ABSTRACT

A semiconductor device with high conductivity interconnection lines formed of high conductivity material, such as copper, is manufactured using tantalum nitride material as barrier material between an aluminum layer, such as the wire bonding layer, and the underlying high conductivity interconnection lines. The tantalum nitride material contains high nitrogen content.

39 Claims, 2 Drawing Sheets

PAD STRUCTURE FOR COPPER INTERCONNECTION AND ITS FORMATION

TECHNICAL FIELD

The present invention relates generally to semiconductors and more specifically to barrier materials and pad structures used in semiconductor devices comprising high conductivity interconnection lines.

BACKGROUND ART

Conventional semiconductor devices typically are made up of a semiconductor substrate, normally a monocrystalline silicon with a plurality of dielectric and conductive layers formed thereon. An integrated circuit is formed of semiconductor devices connected by a plurality of spaced-apart conductive lines and a plurality of interconnection lines, such as bus lines, word lines and logic interconnection lines. Such interconnection lines generally constitute a limiting factor in terms of various functional characteristics of the integrated circuit. There exists a need to provide a reliable interconnection structure capable of achieving higher operating speeds, improved signal-to-noise ratio, improved wear characteristics, and improved reliability.

Most interconnection lines are made of aluminum or an aluminum-base alloy. The performance of a semiconductor device could be improved by forming the interconnection line of a metal having a higher conductivity than aluminum, thereby increasing current handling capability. It is known that copper, copper-base alloys, gold, gold-base alloys, silver and silver-base alloys generally exhibit a higher conductivity than aluminum and aluminum-base alloys, but each has its own drawbacks. One drawback of using copper, for example, is that copper readily diffuses through silicon dioxide, the typical dielectric material employed in the manufacture of semiconductor devices. Moreover, a low cost satisfactory method for etching copper has yet to be developed.

One method of forming copper interconnection lines is by using a "damascene" technique. Damascene is an art which has been employed for centuries in the fabrication of jewelry, and has recently been adapted for application in the semiconductor industry. Damascene basically involves the formation of a trench or a channel opening that is filled with a metal to form a channel. The traditional etch back technique of providing an interconnection structure involves depositing a metal layer, forming a conductive pattern with interwiring spacings, and filling the interwiring spacings with dielectric material. Thus, damascene differs from the traditional etch back technique by forming a pattern of openings in a dielectric layer, which openings are filled in with metal to form a conductive pattern followed by planarization.

In a "dual damascene" technique, two channels of conductive materials are positioned in vertically separate planes perpendicular to each other and interconnected by a vertical "via" at the closest point.

According to conventional practices, a plurality of conductive layers are formed over a semiconductor substrate, and the uppermost conductive layer joined to a bonding pad for forming an external electrical connection. In copper interconnection process, conductive layers would be formed by either damascene or dual damascene techniques. The uppermost conductive layer of the integrated circuit which is to be connected to the chip carrier is typically referred to as the wire bonding layer. The wire bonding layer has bonding pads which are used to make external connections by means of electrically conductive wires and external connection electrodes.

The most commonly used materials for the wire bonding layer are aluminum or aluminum-base alloys, such as aluminum with 2% copper. During the wire bonding process, the semiconductor device would be heated to above 200° C. A bonding tool coupled to a bonding machine would connect the bonding pads with external connection electrodes using electrically conductive wires. The electrically conductive wires are bonded to the bonding pads by the bonding tool using ultrasonic and thermal energies.

Copper or copper-base alloys are not used as wire bonding layers because copper or copper-base alloys tend to oxidize readily at temperature above 200° C. Once oxidized, the bonding pads would not be suitable for wire bonding. Therefore, even though the semiconductor industry is moving towards using copper as the material for interconnection lines, aluminum or aluminum-base alloys continue to be used as the materials for bonding pads.

A suitable conductive barrier layer is needed between the aluminum, or aluminum-base alloy, bonding pads and the underlying copper interconnection lines. Such a barrier layer can be conveniently formed by employing a material that is substantially impervious to the diffusion of aluminum atoms therethrough into the copper interconnection lines and to the diffusion of copper atoms therethrough into the aluminum or aluminum-base alloy bonding pads.

It is well known that titanium nitride (TiN) is a suitable conductive barrier material for aluminum, aluminum-base alloys, and copper. However, in copper interconnection processes, conventional tantalum nitride (TaN) is the most commonly used conductive barrier material. Besides TaN, tantalum silicon nitride (TaSiN) can also be used as a conductive barrier material for copper interconnection processes. The use of TiN would require additional deposition chambers because the deposition of TiN and TaN cannot be performed using the same deposition chamber. The need for additional deposition chambers for TiN deposition undesirably increases the cost and process complexity for the production of semiconductor devices.

Conventional TaN typically contains a nitrogen content by atomic weight of 20%. However, aluminum atoms from aluminum or aluminum-base alloys diffuse readily through conventional TaN, making it unsuitable for use as a conductive barrier layer between aluminum or aluminum-base alloys and copper interconnection lines. A method to form improved TaN layers that can be used as conductive barrier layers between aluminum or aluminum-base alloys and copper interconnection lines has long been sought but has eluded those skilled in the art.

DISCLOSURE OF THE INVENTION

The present invention provides tantalum nitride materials that are substantially impervious to the diffusion of aluminum atoms of an aluminum layer therethrough into an underlying conductive layer and the diffusion of atoms of the underlying conductive layer therethrough into the aluminum layer.

The present invention provides a method of manufacturing semiconductors having high conductivity interconnection lines, such as copper, by using a tantalum nitride material as a conductive barrier material between aluminum layers and the underlying high conductivity interconnection lines.

The present invention further provides a method of manufacturing semiconductors having high conductivity interconnection lines, such as copper, by using tantalum nitride materials which have high nitrogen content by atomic weight as a conductive barrier material between aluminum layers and the underlying high conductivity interconnection lines.

The present invention still further provides a method of forming tantalum nitride materials with high nitrogen content by increasing the nitrogen gas flow rate during the deposition of the tantalum nitride material.

The present invention also provides a semiconductor device having tantalum nitride materials with high nitrogen content by atomic weight as a conductive barrier material between aluminum layers and the underlying high conductivity interconnection lines formed of a material such as copper.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
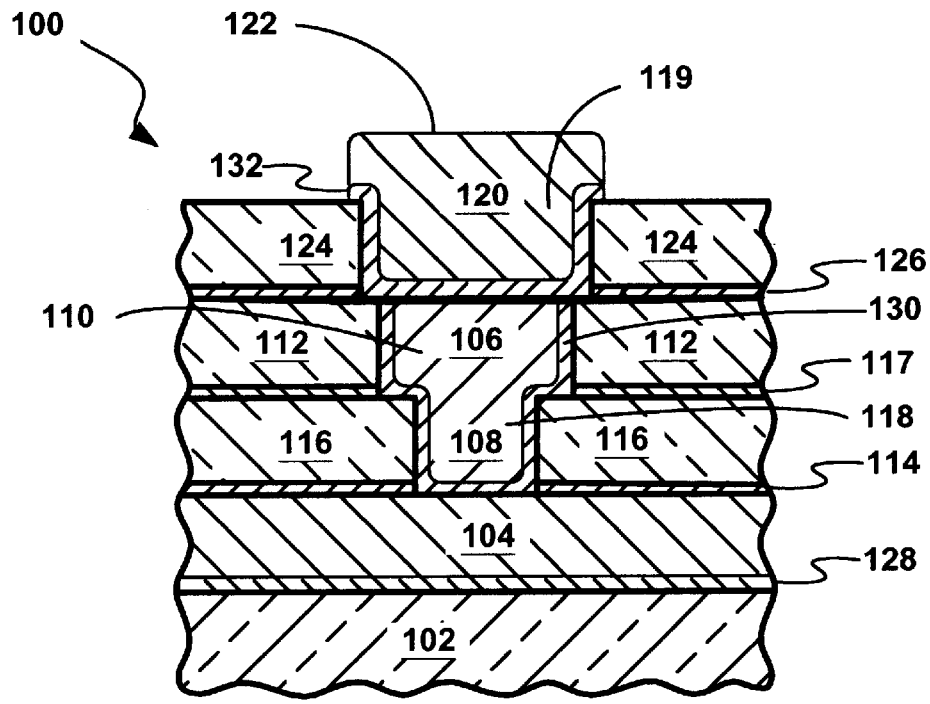
FIG. 1 (PRIOR ART) is a cross-section of semiconductor wafer with a pair of aligned semiconductor channels of conductive materials and a bonding pad disposed over a silicon substrate.

Referring now to FIG. 1 (PRIOR ART), therein is shown a cross-section of semiconductor wafer 100 with a pair of aligned semiconductor channels of a conductive material, such as copper, disposed over a silicon substrate 102. A first channel 104 is shown disposed below a second channel 106 which extends substantially perpendicular to the first channel 104. Similarly, a via 108 connects the first and second channels 104 and 106, which is a part of the second channel 106. The first channel 104 comprises a first conductive material. The second channel 106 is formed by filling a second channel opening 110 disposed in a second channel oxide layer 112 with a second conductive material.

The first and second channels 104 and 106 are in horizontal planes separated vertically by a first stop nitride layer 114, a via oxide layer 116, and a thin via nitride layer 117. The cylindrical via opening 118 forms the cylindrical via 108 when it is filled with the second conductive material.

A wire bonding layer 120, typically an aluminum or aluminum-base alloy, is the uppermost conductive layer and is shown disposed over the second channel 106. The wire bonding layer 120 comprises aluminum or aluminum-base alloys.

The second channel 106 and the wire bonding layer 120 are in horizontal planes separated vertically by a second stop nitride layer 126 and an oxide layer 124.

Also shown disposed around the first channel 104 is barrier material 128, around the second channel 106 and the cylindrical via 108 is barrier material 130, and around the wire bonding layer 120 is barrier material 132. Barrier materials, where necessary, are used to prevent electromigration or diffusion of the conductive materials into the adjacent areas of the semiconductor. Tantalum nitride is the most commonly used barrier material for copper channels.

Accordingly, barrier material 128 and 130 would be tantalum nitride. In the prior art, since the wire bonding layer comprises aluminum or aluminum-base alloys, the barrier material would be titanium nitride since conventional tantalum nitride is not a suitable barrier material for aluminum or aluminum-base alloys.

Figure 2:
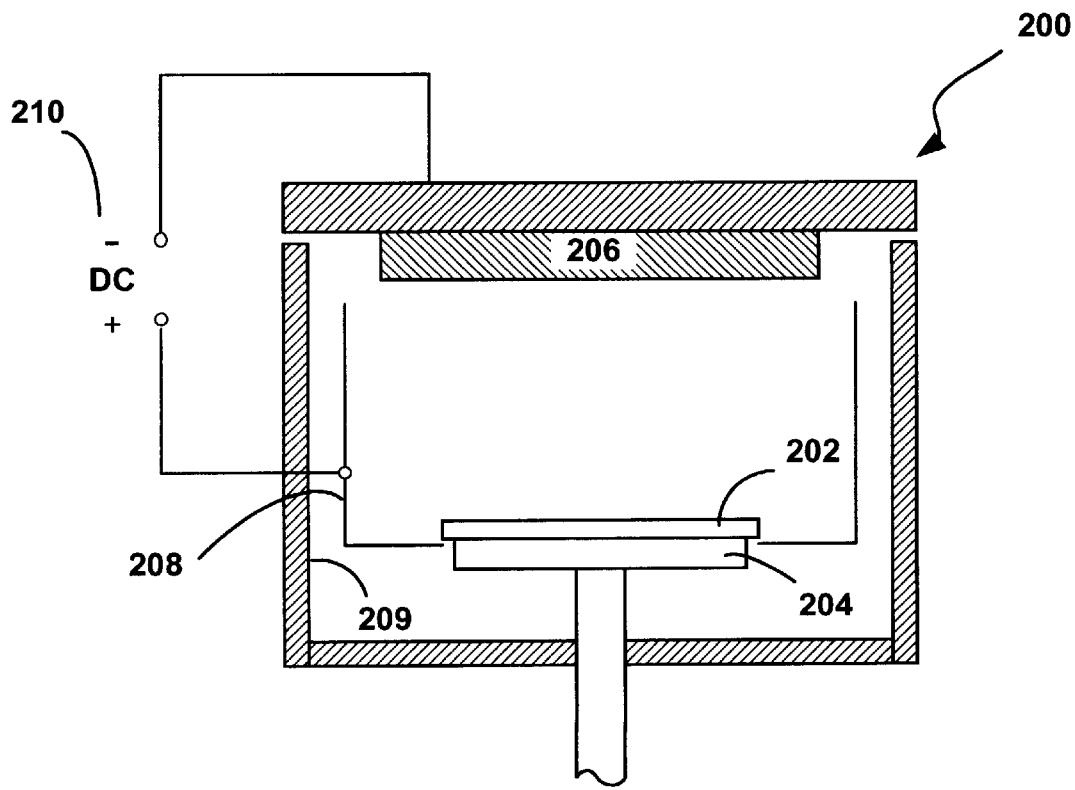
FIG. 2 (PRIOR ART) is a physical vapor deposition chamber.

Referring now to FIG. 2 (PRIOR ART), therein is shown a physical vapor deposition chamber 200. Chamber 200 can be used to deposit or sputter metal films, such as conductive barrier materials, onto the surface of a silicon substrate 202. Substrate 202 is disposed over a substrate holder 204 and is positioned face-up in the chamber 200. A target 206 is shown positioned face-down within the chamber 200. The target 206 is made of the material that is to be deposited onto the silicon substrate 202. A shield 208 is positioned within the interior of the chamber 200 to prevent target material from being deposited on the interior walls 209 of the chamber 200. Chamber 200 also includes inlets (not shown) for receiving gases such as argon and nitrogen that are to be used during the deposition of metal films. A direct current (DC) voltage source 210 is coupled between the target 206 (cathode), and the shields 208 (anode) for generating a plasma using argon gas. By applying a negative voltage to the target 206, the ions in the plasma will be attracted to the target 206 as the plasma is formed. As the plasma ions strike the target 206, particles are sputtered from the surface of the target 206 at a significant kinetic energy. The sputtered particles from target 206 are then deposited onto the silicon substrate 202 in the form of a thin metal film.

Chamber 200 can be used to conduct reactive sputtering using more than one element to make up the deposition material. In a reactive sputtering process, nitrogen gas would be introduced into the chamber 200 during the deposition. As a result, the sputter surface of the target 206 is in a nitrided-mode. For example, when TaN is to be deposited onto the silicon substrate 202, the target 206 would be formed of tantalum. In the nitrided-mode, the nitrogen gas would cause tantalum nitride to be deposited. Similarly, when TaSiN is to be deposited onto the silicon substrate 202, the target 206 would be formed of tantalum silicon. In the nitrided-mode, the nitrogen gas would cause tantalum silicon nitride to be deposited. The nitrided compound, e.g., TaN or TaSiN, would be deposited onto the silicon substrate 202 during the physical vapor deposition.

As explained in the Background Art, copper or copper-base alloys are not used as wire bonding layer because copper or copper-base alloys tend to oxidize readily at the wire bonding temperature which is above 200° C. Once oxidized, the bonding pads would not be suitable for wire bonding because the oxide acts as an insulator. Therefore, aluminum or aluminum-base alloys continue to be used as the materials for bonding pads even in the copper interconnection processes.

In the copper interconnection processes, conventional tantalum nitride (TaN) is the most commonly used conductive barrier. However, aluminum atoms from aluminum or aluminum-base alloys diffuse readily through conventional TaN, making it unsuitable for use as a conductive barrier layer between aluminum or aluminum-base alloys bonding pads and copper interconnection lines.

Although titanium nitride (TiN) is a suitable conductive barrier for aluminum, aluminum-base alloys and copper, the use of TiN as a conductive barrier would require additional deposition chambers because the deposition of TiN and TaN cannot be performed using the same deposition chamber. The need for additional deposition chambers for TiN deposition undesirably increases the cost and process complexity for the production of the semiconductor devices.

The present invention provides a method for forming improved tantalum nitride material layers that can be used as conductive barrier layers between aluminum or aluminum-base alloys and high conductivity connection lines formed of material such as copper.

Figure 3:
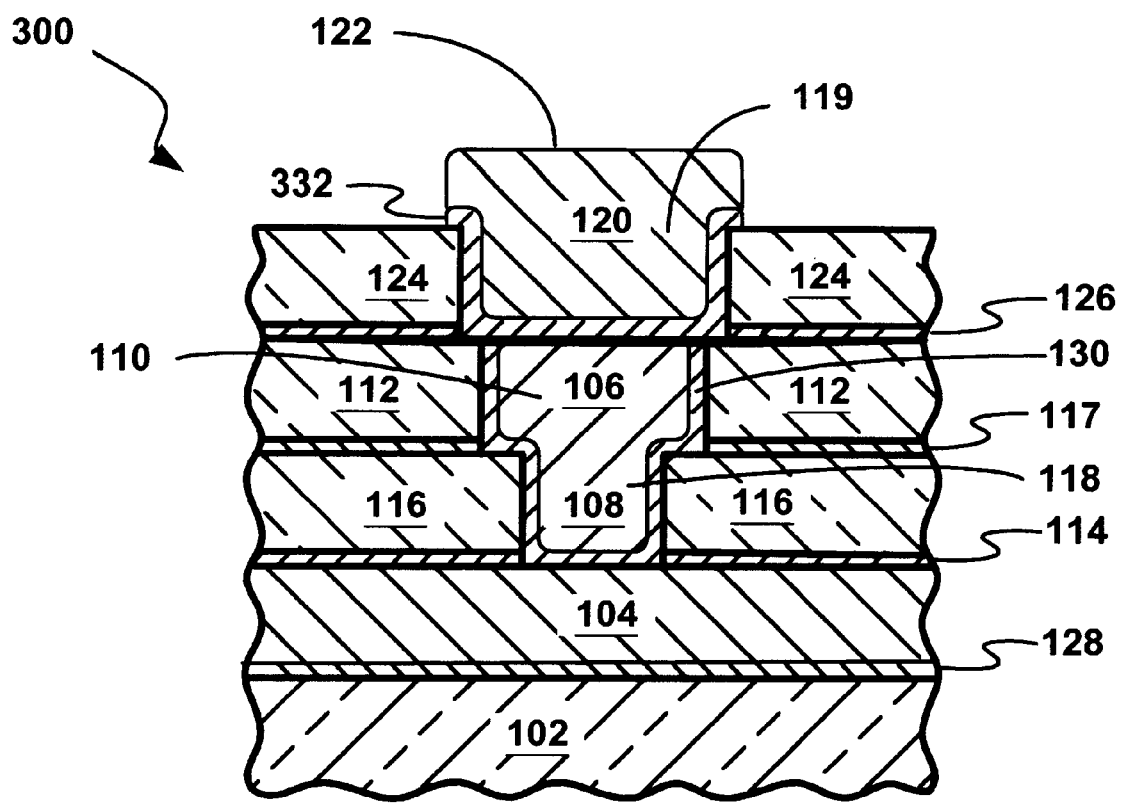
FIG. 3 is a cross-section of semiconductor wafer with a pair of aligned semiconductor channels of a conductive material and a bonding pad disposed over a silicon substrate manufactured in accordance with the present invention.

Referring to FIG. 3, therein is shown the cross-section of a semiconductor wafer 300 with a pair of aligned semiconductor channels of a conductive material, such as copper, disposed over a silicon substrate 102 formed in accordance with the present invention. For convenience of illustration, like reference numerals are used in FIG. 3 to denote like elements already described in FIG. 1. FIG. 3 is identical to FIG. 1 except that in this preferred embodiment, barrier material 332 is formed of tantalum nitride material such as $TaN_2$, a combination of TaN and $TaN_2$, $TaSiN_2$, a combination of TaSiN and $TaSiN_2$, or a combination of the aforegoing with a nitrogen content by atomic weight of between 20% and 40%. Unlike the conventional tantalum nitride which comprises a nitrogen content by atomic weight of about 20%, the material formed according to the present invention contains a nitrogen content by atomic weight of more than about 30% and less than about 40%. The tantalum nitride material formed is substantially impervious to the diffusion of aluminum atoms therethrough into the second copper channel 106 and the diffusion of copper atoms therethrough into the aluminum bonding pad 122. Therefore, the tantalum nitride material is suitable to be used as a barrier material between the bonding pad 122 and copper channel 106. As described earlier, barrier materials 128 and 130 also comprise TaN since TaN would be used for copper interconnection lines. Accordingly, with the present invention, the same deposition chamber can be used for forming barrier material 128, 130, and 232 and no additional TiN deposition chamber is required.

In production, a conventional first damascene process was used to put down over a production semiconductor wafer 300 a first channel 104 in a first channel oxide layer (not shown) above portions of a semiconductor device which is formed over a silicon substrate 102. The damascene process is a photolithographic process which uses a mask to define a first channel opening (not shown) in the first channel oxide layer to run in a first direction (which is horizontal in FIG. 1). The first channel opening is then filled with a first conductive material, such as copper, to form the first channel 104 using conventional metal deposition technique, such as physical vapor deposition, chemical vapor deposition, electroplating, or a combination thereof. The stop nitride layer 114, the via oxide layer 116, and the via nitride layer 117 would be successively deposited on top of the first channel 104 and the first channel oxide layer using conventional deposition technique.

By using the via photoresist and the via photolithographic process followed by nitride etching of a round via opening 118 in the via nitride layer 117, the basis for the cylindrical via 108 was formed. The subsequent deposition of the second channel oxide layer 112 prepared the way for the second channel 106 to be perpendicular to the first channel 104. The second damascene process is a photolithographic process which uses a mask to define the second channel opening 110 in the second channel oxide layer 112. Since the second damascene process uses an anisotropic oxide etch, the etch also forms the cylindrical via opening 118 down to the stop nitride layer 114. The anisotropic oxide etch etches faster in the vertical direction of FIG. 1 than in the horizontal direction. The nitride etch of the stop nitride layer 114 completes the etching steps. The deposition of the barrier material 130, such as a conventional TaN and the second conductive material, such as copper, into second channel opening 110 and via opening 118 forms the second channel 106 and the cylindrical via 108. The barrier material 130 is deposited using conventional deposition techniques, such as physical vapor deposition, chemical vapor deposition, or a combination thereof. Similarly, the second conductive material is deposited using conventional metal deposition technique, such as physical vapor deposition, chemical vapor deposition, electroplating, or a combination thereof. Thereafter, a chemical mechanical polishing process is used to complete the conventional connection process.

Thereafter, a second stop nitride layer 126 and the wire bonding oxide layer 124 would be successively deposited over the second channel 106 and the second channel oxide layer 112 using conventional deposition techniques. By using a conventional photolithographic and etching process, a bonding pad opening 119 would be formed in the wire bonding oxide layer 124 and over second channel 106.

Next, the barrier material 332 is deposited over the sidewalls and the bottom of the bonding pad opening 119 in accordance with the present invention. In a preferred embodiment, the barrier material 332 is the tantalum nitride material. It can be deposited using the deposition chamber 200. Chamber 200 would be pumped down to a vacuum in the milli-Torr (mTorr) range after the semiconductor wafer 300 has been positioned over the substrate support 204. Argon and nitrogen gases are then introduced into the chamber 200. A high DC voltage is applied across the target 206 and the shield 208 using DC voltage source 210 to generate a plasma. The nitrogen converts the target 206 into a nitrided-mode so that reactive sputtering can take place which results in the deposition of a layer of $TaN_2$ or the combination of $TaN_2$ and TaN over the sidewalls and the bottom of the bonding pad opening 119. In the best mode, the flow rate of the nitrogen gas would be within the range of about 28 to about 40 sccm (standard cubic centimeters), while the flow rate of the argon gas would be about 45 sccm. The deposition pressure would be within the range of about 5 mTorr to about 20 mTorr, and preferably about 8 mTorr. The DC power supplied by the DC voltage source 210 would be within the range of about 0.5 kW to about 4 kW, and preferably about 2 kW.

To deposit $TaN_2$ or the combination of $TaN_2$ and TaN, it is important to maintain a high nitrogen flow rate relative to the argon flow rate. Specifically, $TaN_2$ or the combination of $TaN_2$ and TaN will be formed when the ratio of the nitrogen flow rate and the argon flow rate is within the range of about 28/45 to about 40/45. Further, the DC power should not be more than about 4 kW because higher DC power tends to reduce the amount of nitrogen incorporation into the resulting tantalum nitride material, making it unsuitable to act as a conductive barrier between aluminum or aluminum-base alloys and copper.

It has also been determined that a conductive barrier of 50 angstroms thickness will perform the barrier function satisfactorily. However, due to current bonding impacts which cause physical damage to the conductive barrier, thicknesses of between 400 to 500 angstroms are currently preferred.

After the deposition of barrier material 332 in the bonding pad opening 119, the bonding pad opening 119 is filled with aluminum or aluminum-base alloys followed by a conventional photolithographic and etching process to form the wire bonding layer 120 which comprises a bonding pad 122.

Accordingly, with the present invention, the improved tantalum nitride material can be formed which functions as a conductive barrier material between aluminum or aluminum-base alloys and copper. Therefore, the same deposition chamber can be used for forming barrier material layers for copper interconnection lines without the need for additional TiN deposition chambers.

While the best mode utilizes copper as the conductive material, it should be understood that the present invention is applicable to other high conductivity materials such as copper-base alloys, gold, gold-base alloys, silver, and silver-base alloys. Further, the present invention is also applicable to provide a layer of $TaSiN_2$ or a combination of $TaSiN_2$ and TaSiN that can be used as conductive barrier materials between aluminum or aluminum-base alloys and copper.

As would be evident to those skilled in the art, besides physical vapor deposition, other deposition techniques, such as chemical vapor deposition, could be used to deposit the tantalum nitride material that can be used as conductive barrier materials between aluminum or aluminum-base alloys and high conductivity materials such as copper.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising the steps of:
   forming a conductive layer on a semiconductor substrate;
   forming a conductive barrier layer on said conductive layer wherein said conductive barrier layer is a tantalum nitride material selected from the group consisting of $TaN_2$, $TaSiN_2$, the combination of TaSiN and $TaSiN_2$, and the combination of $TaN_2$, TaSiN and $TaSiN_2$; and
   forming an aluminum layer on said conductive barrier layer; wherein said conductive barrier layer is substantially impervious to the diffusion of aluminum atoms therethrough into said conductive layer and the diffusion of atoms of said conductive layer therethrough into said aluminum layer.

2. The method as claimed in claim 1, wherein said conductive layer is a metal selected from the group consisting of copper, copper-based alloys, gold, gold-based alloys, silver, and silver-based alloys.

3. The method as claimed in claim 1, wherein said conductive barrier layer has a thickness greater than 50 angstroms.

4. The method as claimed in claim 1, wherein said tantalum nitride material contains a nitrogen content by atomic weight of more than about 30%.

5. The method as claimed in claim 1, wherein said tantalum nitride material contains a nitrogen content by atomic weight of less than about 40%.

6. The method as claimed in claim 1, wherein said aluminum layer constitutes a wire bonding layer for external connection thereto.

7. The method as claimed in claim 1, wherein said conductive layer is in electrical and physical contact with said conductive barrier layer, and said first conductive barrier layer is in electrical and physical contact with said aluminum layer.

8. The method as claimed in claim 1, wherein the step of forming said conductive barrier layer uses reactive sputtering.

9. The method as claimed in claim 1, wherein the step of forming said conductive barrier layer comprises:
   placing said semiconductor substrate in a physical vapor deposition chamber, said chamber comprises a tantalum-containing target;
   introducing argon gas at a first flow rate;
   introducing nitrogen gas at a second flow rate wherein the ratio of said first flow rate to said second flow rate is within the range of about 28/45 to about 40/45;
   generating a plasma in said chamber using a voltage;
   maintaining said chamber at a first pressure; and
   depositing said conductive barrier layer.

10. The method as claimed in claim 9, wherein said first flow rate is about 45 sccm, and said second flow rate is within the range of about 28 to about 40 sccm.

11. The method as claimed in claim 9, wherein said first pressure is within the range of about 5 mTorr to about 20 mTorr.

12. The method as claimed in claim 9, wherein the step of generating said plasma in said chamber comprises using power within the range of about 0.5 kW to about 4 kW.

13. The method as claimed in claim 9, wherein said tantalum-containing target contains a material selected from the group containing tantalum and tantalum silicon.

14. A method of manufacturing a semiconductor device, comprising the steps of:
   forming a conductive layer on a semiconductor substrate;
   forming a conductive barrier layer on said conductive layer wherein said conductive barrier layer is a tantalum nitride material, wherein said tantalum nitride material is $TaN_2$ and $TaSiN_2$; and
   forming an aluminum layer on said conductive barrier layer; wherein said conductive barrier layer is substantially impervious to the diffusion of aluminum atoms therethrough into said conductive layer and the diffusion of atoms of said conductive layer therethrough into said aluminum layer.

15. The method as claimed in claim 14, wherein said conductive layer is a metal selected from the group consisting of copper, copper-based alloys, gold, gold-based alloys, silver, and silver-based alloys.

16. The method as claimed in claim 14, wherein said conductive barrier layer has a thickness greater than 50 angstroms.

17. The method as claimed in claim 14, wherein said tantalum nitride material contains a nitrogen content by atomic weight of more than about 30%.

18. The method as claimed in claim 14, wherein said tantalum nitride material contains a nitrogen content by atomic weight of less than about 40%.

19. The method as claimed in claim 14, wherein said aluminum layer constitutes a wire bonding layer for external connection thereto.

20. The method as claimed in claim 14, wherein said conductive layer is in electrical and physical contact with said conductive barrier layer, and said first conductive barrier layer is in electrical and physical contact with said aluminum layer.

21. The method as claimed in claim 14, wherein the step of forming said conductive barrier layer uses reactive sputtering.

22. The method as claimed in claim 14, wherein the step of forming said conductive barrier layer comprises:
   placing said semiconductor substrate in a physical vapor deposition chamber, said chamber comprises a tantalum-containing target;

introducing argon gas at a first flow rate;

introducing nitrogen gas at a second flow rate wherein the ratio of said first flow rate to said second flow rate is within the range of about 28/45 to about 40/45;

generating a plasma in said chamber using a voltage;

maintaining said chamber at a first pressure; and depositing said conductive barrier layer.

23. The method as claimed in claim 22, wherein said first flow rate is about 45 sccm, and said second flow rate is within the range of about 28 to about 40 sccm.

24. The method as claimed in claim 22, wherein said first pressure is within the range of about 5 mTorr to about 20 mTorr.

25. The method as claimed in claim 22, wherein the step of generating said plasma in said chamber comprises using power Within the range of about 0.5 kW to about 4 kW.

26. The method as claimed in claim 22, wherein said tantalum-containing target contains a material selected from the group containing tantalum and tantalum silicon.

27. A method of manufacturing a semiconductor device, comprising the steps of:

forming a conductive layer on a semiconductor substrate, wherein said conductive layer is a metal selected from the group consisting of copper, copper-based alloys, gold, gold-based alloys, silver, and silver-based alloys;

forming a conductive barrier layer on said conductive layer wherein said conductive barrier layer is a tantalum nitride material selected from the group consisting of $TaN_2$, $TaSiN_2$, the combination of $TaN_2$ and $TaSiN_2$, and the combination of TaSiN and $TaSiN_2$, and the combination of $TaN_2$, TaSiN and $TaSiN_2$; and forming an aluminum layer on said conductive barrier layer; wherein said conductive barrier layer is substantially impervious to the diffusion of aluminum atoms therethrough into said conductive layer and the diffusion of atoms of said conductive layer therethrough into said aluminum layer.

28. The method as claimed in claim 27, wherein said conductive barrier layer has a thickness within the range of about 50 to about 2,000 angstroms.

29. The method as claimed in claim 27, wherein said tantalum nitride material contains a nitrogen content by atomic weight of more than about 30%.

30. The method as claimed in claim 27, wherein said tantalum nitride material contains a nitrogen content by atomic weight of less than about 40%.

31. The method as claimed in claim 27, wherein said aluminum layer constitutes a wire bonding layer for external connection thereto.

32. The method as claimed in claim 27, wherein said conductive layer is in electrical and physical contact with said conductive barrier layer, and said first conductive barrier layer is in electrical and physical contact with said aluminum layer.

33. The method as claimed in claim 27, wherein the step of forming said conductive barrier layer comprises:

placing said semiconductor substrate in a physical vapor deposition chamber, said chamber comprises a tantalum-containing target;

introducing argon gas at a first flow rate;

introducing nitrogen gas at a second flow rate wherein the ratio of said first flow rate to said second flow rate is within the range of about 28/45 to about 40/45;

generating a plasma in said chamber using a voltage, wherein the step of generating said plasma in said chamber uses power within the range of about 0.5 kW to about 4 kW;

maintaining said chamber at a first pressure, wherein said first pressure is within the range of about 5 mTorr to about 20 mTorr; and depositing said conductive barrier layer.

34. The method as claimed in claim 27, wherein said first flow rate is about 45 sccm, and said second flow rate is within the range of about 28 to about 40 sccm.

35. The method as claimed in claim 27, wherein said tantalum-containing target contains tantalum or tantalum silicon.

36. A method of manufacturing a semiconductor device, comprising the steps of:

forming a conductive layer on a semiconductor substrate, wherein said conductive layer is a metal selected from the group consisting of copper, copper-based alloys, gold, gold-based alloys, silver, and silver-based alloys;

forming a conductive barrier layer on said conductive layer wherein said conductive barrier layer is a tantalum nitride material selected from the group consisting of $TaN_2$, $TaSiN_2$, the combination of $TaN_2$ and $TaSiN_2$, and the combination of TaSiN and $TaSiN_2$, and the combination of $TaN_2$, TaSiN and $TaSiN_2$, and has a thickness within the range of about 50 to about 2,000 angstroms; and forming an aluminum layer on said conductive barrier layer wherein said aluminum layer constitutes a wire bonding layer for external connection thereto, said conductive layer is in electrical and physical contact with said conductive barrier layer, and said first conductive barrier layer is in electrical and physical contact with said aluminum layer, wherein said conductive barrier layer is substantially impervious to the diffusion of aluminum atoms therethrough into said conductive layer and the diffusion of atoms of said conductive layer therethrough into said aluminum layer.

37. The method as claimed in claim 36, wherein said tantalum nitride material contains a nitrogen content by atomic weight of more than about 30% and less than about 40%.

38. The method as claimed in claim 36, wherein the step of forming said conductive barrier layer comprises:

placing said semiconductor substrate in a physical vapor deposition chamber, said chamber contains a tantalum-containing target, wherein said tantalum-containing target contains a material selected from the group consisting of tantalum and tantalum silicon;

introducing argon gas at a first flow rate;

introducing nitrogen gas at a second flow rate wherein the ratio of said first flow rate to said second flow rate is within the range of about 28/45 to about 40/45;

generating a plasma in said chamber using a voltage, wherein the step of generating said plasma in said chamber comprises using a power within the range of about 0.5 kW to about 4 kW;

maintaining said chamber at a first pressure, wherein said first pressure is within the range of about 5 mTorr to about 20 mTorr; and depositing said conductive barrier layer.

39. The method as claimed in claim 36, wherein said first flow rate is about 45 sccm, and said second flow rate is within the range of about 28 to about 40 sccm.

* * * * *